(12) United States Patent
Kim et al.

(10) Patent No.: US 12,048,194 B2
(45) Date of Patent: Jul. 23, 2024

(54) DISPLAY APPARATUS COMPRISING THIN FILM TRANSISTOR

(71) Applicant: LG Display Co., Ltd., Seoul (KR)

(72) Inventors: SeungJin Kim, Paju-si (KR); Sohyung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/151,849

(22) Filed: Jan. 9, 2023

(65) Prior Publication Data

US 2023/0165047 A1     May 25, 2023

Related U.S. Application Data

(63) Continuation of application No. 17/116,800, filed on Dec. 9, 2020, now Pat. No. 11,587,992.

(30) Foreign Application Priority Data

Dec. 12, 2019   (KR) ........................ 10-2019-0165250

(51) Int. Cl.
    *H01L 29/786*     (2006.01)
    *H10K 59/12*     (2023.01)

(52) U.S. Cl.
    CPC ....... *H10K 59/12* (2023.02); *H01L 29/78618* (2013.01); *H01L 29/7869* (2013.01)

(58) Field of Classification Search
    CPC .. H10K 59/12; H10K 59/1213; H10K 59/121; H10K 59/123; H10K 50/80; H01L 27/1225; H01L 27/12; H01L 27/1251; H01L 27/1214; H01L 29/78618; H01L 29/786; H01L 29/7869; H01L 29/78645; H01L 29/78651
See application file for complete search history.

(56) References Cited

U.S. PATENT DOCUMENTS

| | | | |
|---|---|---|---|
| 9,035,313 B2 | 5/2015 | Jeong et al. | |
| 9,786,697 B2 * | 10/2017 | Lee | ...... H01L 27/1222 |
| 9,985,082 B2 * | 5/2018 | Lee | ...... H10K 59/126 |
| 10,263,060 B2 | 4/2019 | Noh et al. | |
| 10,269,832 B2 | 4/2019 | Hayashi | |
| 10,297,622 B2 * | 5/2019 | Na | ...... H01L 29/4908 |
| 10,672,849 B2 | 6/2020 | Lee | |
| 10,692,893 B2 | 6/2020 | Lee et al. | |

(Continued)

FOREIGN PATENT DOCUMENTS

| CN | 101621075 A | 1/2010 |
|---|---|---|
| CN | 108257972 A | 7/2018 |

(Continued)

*Primary Examiner* — Nikolay K Yushin
(74) *Attorney, Agent, or Firm* — Seed IP Law Group LLP

(57) ABSTRACT

Disclosed is a display apparatus including a first thin film transistor (TFT) and a second thin film transistor having a bottom gate structure and including an oxide semiconductor layer. The first TFT may be used as a switching device and the second TFT may be used as a driving device, and these TFTs have different operation properties from each other. One or more embodiments of the present disclosure provides a method of arranging a plurality of TFTs having different properties in a display apparatus. This not only provides a display apparatus with TFTs integrated at a high density but also an efficient way of driving the display apparatus.

22 Claims, 10 Drawing Sheets

(56) References Cited

U.S. PATENT DOCUMENTS

| | | | | |
|---|---|---|---|---|
| 10,818,705 | B2* | 10/2020 | Sone | H01L 29/66969 |
| 2016/0372497 | A1* | 12/2016 | Lee | H01L 27/1255 |
| 2017/0271381 | A1* | 9/2017 | Sone | G09G 3/2092 |
| 2017/0309649 | A1 | 10/2017 | Hayashi | |
| 2018/0012947 | A1* | 1/2018 | Lee | H01L 27/1222 |
| 2018/0061868 | A1* | 3/2018 | Na | H01L 29/7869 |
| 2019/0123119 | A1 | 4/2019 | Miyamoto et al. | |

FOREIGN PATENT DOCUMENTS

| | | |
|---|---|---|
| CN | 109698218 A | 4/2019 |
| KR | 10-2018-0012442 A | 2/2018 |
| KR | 10-2018-0061723 A | 6/2018 |

* cited by examiner

DISPLAY APPARATUS COMPRISING THIN FILM TRANSISTOR

CROSS-REFERENCE TO RELATED APPLICATIONS

This application is a continuation of U.S. patent application Ser. No. 17/116,800, filed Dec. 9, 2020, which claims the benefit of the Korean Patent Application No. 10-2019-0165250 filed on Dec. 12, 2019, which are hereby incorporated by reference as if fully set forth herein.

BACKGROUND

Technical Field

The present disclosure relates to a display apparatus and a method for manufacturing the same. In more detail, the present disclosure relates to a display apparatus including a plurality of thin film transistors disposed on different layers.

Description of the Related Art

A display apparatus which displays various information on a screen is a technology-intensive device in which core technologies of an information communication field are integrated. Recently, the display apparatus has been developed so as to realize thin profile, lightness, portability, and furthermore, high performance. Typical examples of the display apparatus may be a liquid crystal display (LCD) apparatus and an organic light emitting diode display (OLED) apparatus.

A thin film transistor is used as a switching device or a driving device in the display apparatus. Recently, with the advancement of high quality and high resolution in the display apparatus, the thin film transistor is integrated at a high density in the display apparatus.

BRIEF SUMMARY

The inventors of the present disclosure have appreciated that the properties of the thin film transistor used as the switching device are not the same as the properties of the thin film transistor used as the driving device. Having this in mind, the inventors have further recognized that a new method of arranging large number of thin film transistors in a limited area may be beneficial for efficiently driving the display apparatus.

Accordingly, the present disclosure has been made in view of one or more problems in the related art including the above problems identified by the inventors.

Thus, one or more embodiments of the present disclosure provides a display apparatus with a thin film transistor integrated at a high density.

One or more embodiments of the present disclosure provides a display apparatus including a plurality of thin film transistors having the different operation properties.

One or more embodiments of the present disclosure provides a novel way of arranging the plurality of thin film transistors having the different properties in one display apparatus.

Further embodiments of the present disclosure provides a display apparatus including a plurality of thin film transistors disposed on the different layers and integrated at a high density.

Further embodiments of the present disclosure provides a display apparatus including a plurality of thin film transistors having the different s-factor values and having the different operation properties.

In accordance with an aspect of the present disclosure, the above and other technical benefits can be accomplished by the provision of a display apparatus including a substrate, a first gate electrode on the substrate, a first active layer spaced apart from the first gate electrode and provided with at least a portion overlapped with the first gate electrode, a first source electrode and a first drain electrode connected with the first active layer respectively, a second gate electrode connected with any one of the first source electrode and the first drain electrode, a second active layer spaced apart from the second gate electrode and provided with at least a portion overlapped with the second gate electrode, a second source electrode and a second drain electrode connected with the second active layer respectively, and a display element connected with any one of the second source electrode and the second drain electrode, wherein the first gate electrode is disposed between the substrate and the first active layer, the second gate electrode is disposed between the substrate and the second active layer, and the first active layer and the second active layer include an oxide semiconductor material.

In some embodiments, the first active layer includes a first oxide semiconductor layer on the first gate electrode, and a second oxide semiconductor layer on the first oxide semiconductor layer.

In some embodiments, the second active layer may be formed of one oxide semiconductor layer.

In some embodiments, a composition of a metal included in the second active layer may be identical or substantially identical to a composition of a metal included in the first oxide semiconductor layer of the first active layer.

In some embodiments, the second gate electrode may be formed as one body with any one of the first source electrode and the first drain electrode.

In some embodiments, the first source electrode, the first drain electrode and the second gate electrode may be manufactured by the same process using the same material.

In one embodiment, the first source electrode, the first drain electrode, and the second gate electrode includes the same material.

The display apparatus may further include a first capacitor electrode disposed on the same layer as that of the first gate electrode, a second capacitor electrode disposed on the same layer as those of the first source electrode and the first drain electrode, and a third capacitor electrode disposed on the same layer as those of the second source electrode and the second drain electrode.

In some embodiments, the second capacitor electrode may be formed as one body with any one of the first source electrode and the first drain electrode.

In some embodiments, the first capacitor electrode and the third capacitor electrode may be connected with each other.

The display apparatus may further include a fourth capacitor electrode disposed on the same layer as that of the second gate electrode.

In some embodiments, the fourth capacitor electrode may be connected with any one of the second source electrode and the second drain electrode.

In some embodiments, the first capacitor electrode may be connected with the fourth capacitor electrode, and the second capacitor electrode is connected with the third capacitor electrode.

In some embodiments, the display element includes an organic light emitting diode.

In some embodiments, the first gate electrode, the first active layer, the first source electrode and the first drain electrode constitute the first thin film transistor, and the second gate electrode, the second active layer, the second source electrode and the second drain electrode constitute the second thin film transistor.

In some embodiments, an s-factor value of the second thin film transistor is larger than an s-factor value of the first thin film transistor.

In some embodiments, the first thin film transistor includes a switching transistor, and the second thin film transistor includes a driving transistor.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings. In the drawings.

DETAILED DESCRIPTION

Figure 1:
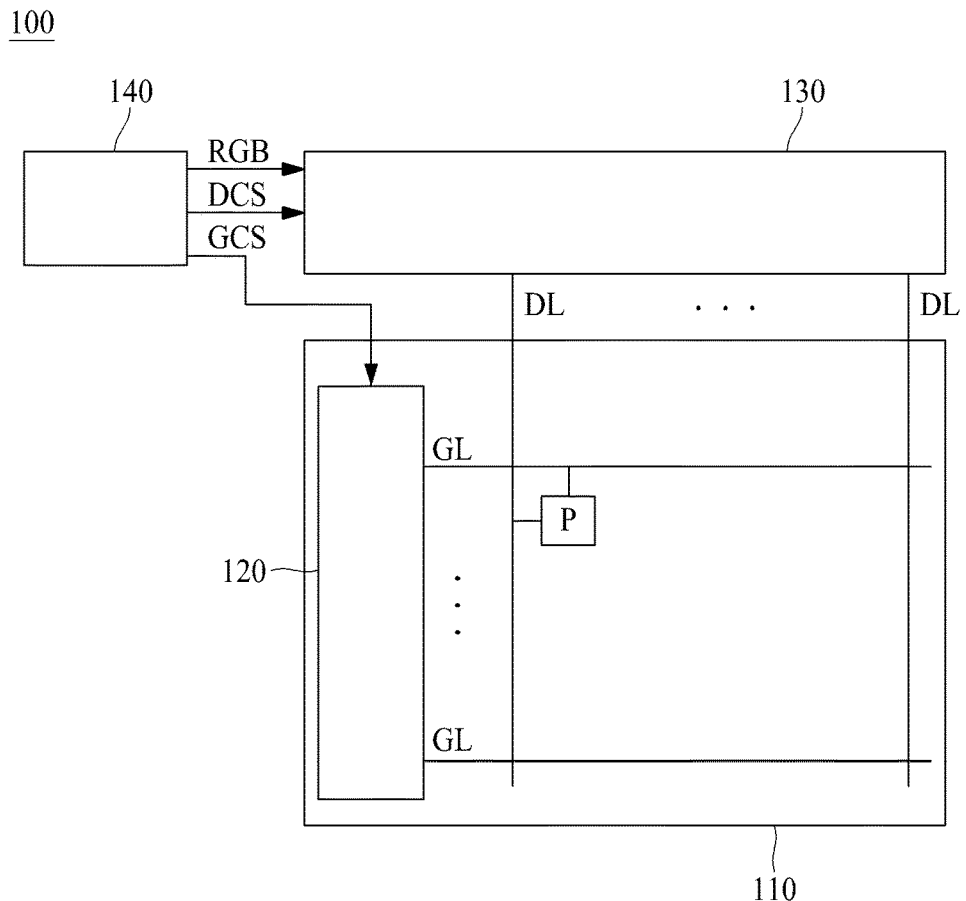
FIG. 1 is a schematic view illustrating a display apparatus according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath," and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, in some embodiments, the source electrode may be the drain electrode, and in other embodiments, the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic view illustrating a display apparatus 100 according to one embodiment of the present disclosure.

As shown in FIG. 1, the display apparatus 100 according to one embodiment of the present disclosure includes a display panel 110, a gate driver 120, a data driver 130, and a controller 140.

The display panel 110 includes gate lines (GL) and data lines (DL), and a pixel (P) arranged at adjacent to an overlapping portion of the gate line (GL) and the data line (DL). The pixel (P) may include a display element 710 and a pixel driving circuit (PDC) configured to drive the display element 710. An image is displayed on the display panel 110 by driving the pixel (P).

The controller 140 controls the gate driver 120 and the data driver 130.

The controller 140 outputs a gate control signal (GCS) for controlling the gate driver 120, and a data control signal (DCS) for controlling the data driver 130 by the use of vertically/horizontally synchronized signal and clock signal supplied from an external system (not shown). Also, the controller 140 samples input video data, which is provided from the external system, and then re-aligns the sampled video data, and supplies the re-aligned video data (RGB) to the data driver 130.

In some embodiments, the gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

In some embodiments, the data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into the data voltage, and supplies the data voltage to the data lines (DL).

The gate driver 120 sequentially supplies a gate pulse (GP) to the gate lines (GL) for 1 frame period. Herein, '1 frame' indicates the period in which an image is output through the use of display panel 110. Also, the gate driver 120 supplies a gate-off signal for turning off a switching device to the gate line (GL) for the remaining period of 1 frame in which the gate pulse (GP) is not supplied. Hereinafter, the gate pulse (GP) and the gate-off signal (Goff) may be referred to as scan signals (SS).

According to one embodiment of the present disclosure, the gate driver 120 may be provided in the display panel 110. A structure of directly providing the gate driver 120 on the display panel 110 may be referred to as a Gate-In-Panel (GIP) structure.

Figure 2:
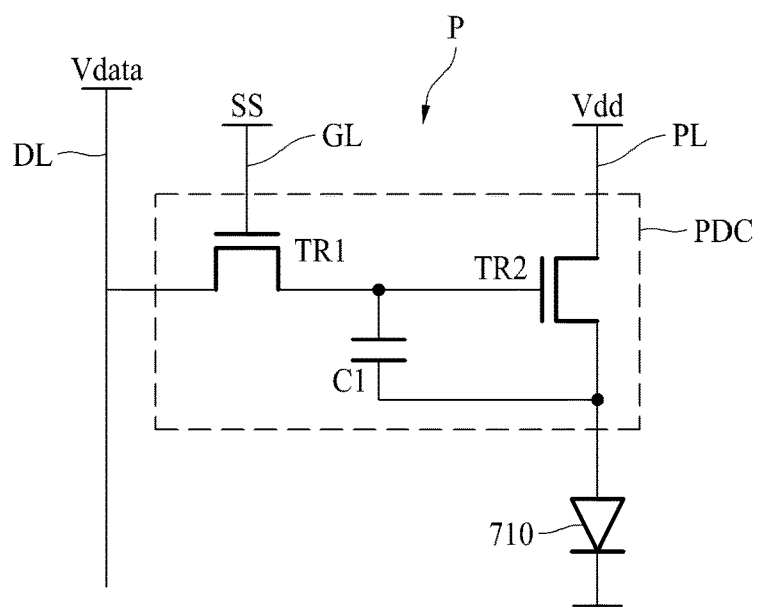
FIG. 2 is a circuit diagram for a pixel of FIG. 1.
Figure 3:
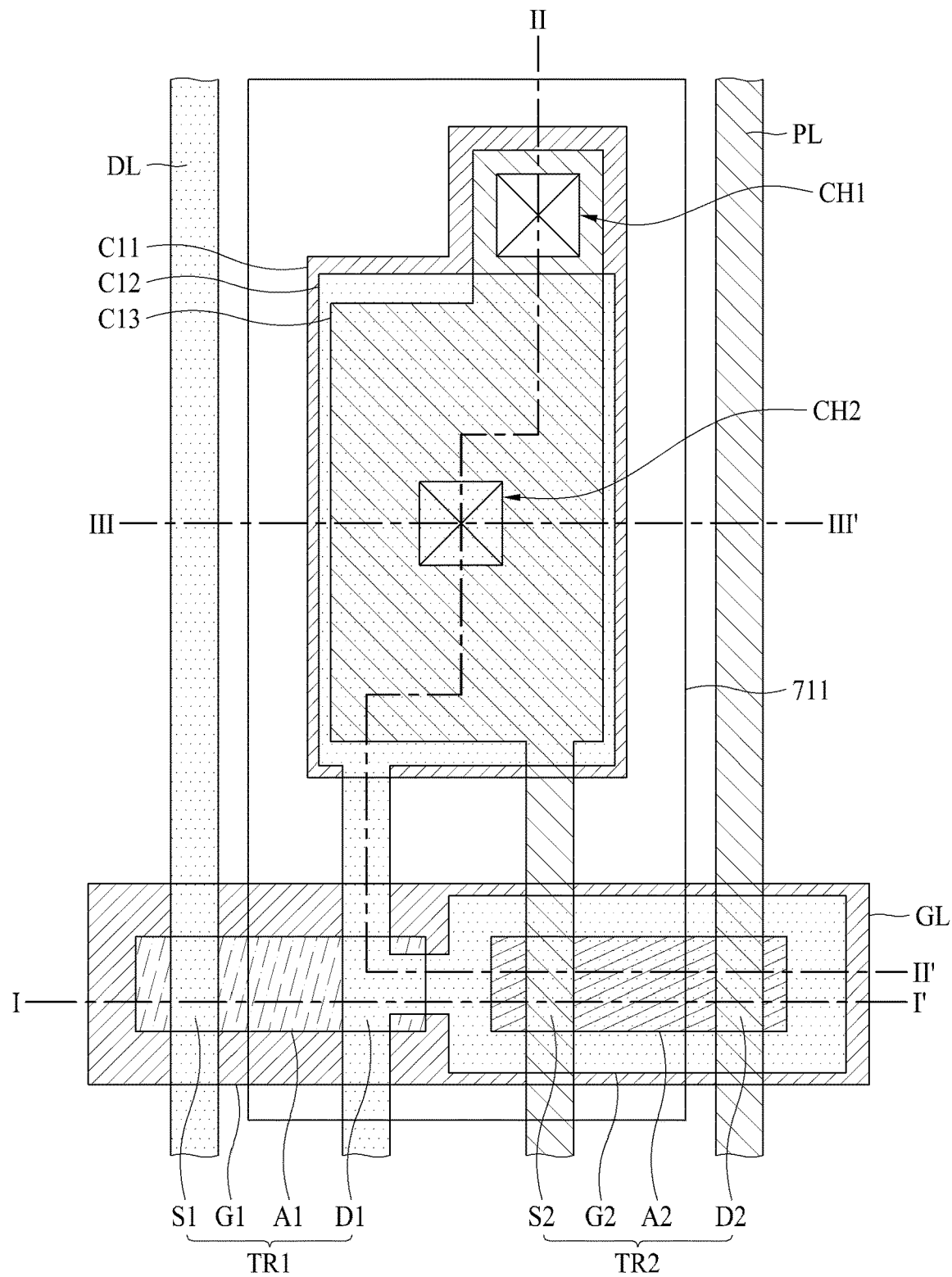
FIG. 3 is a plan view illustrating the pixel of FIG. 2.
Figure 4:
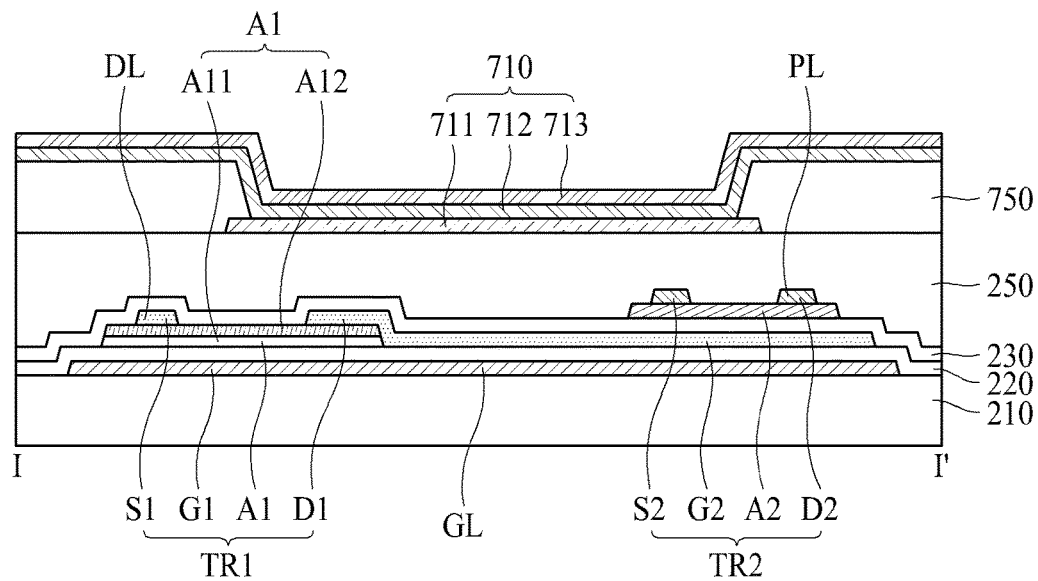
FIG. 4 is a cross-sectional view along I-I' of FIG. 3.
Figure 5:
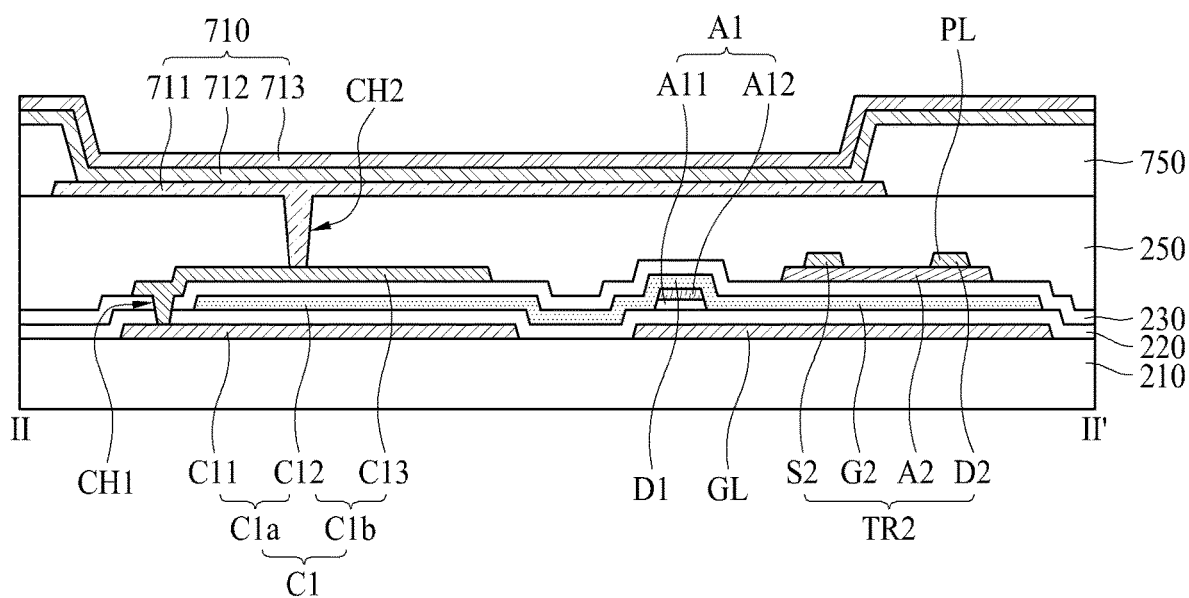
FIG. 5 is a cross-sectional view along II-IP of FIG. 3.
Figure 6:
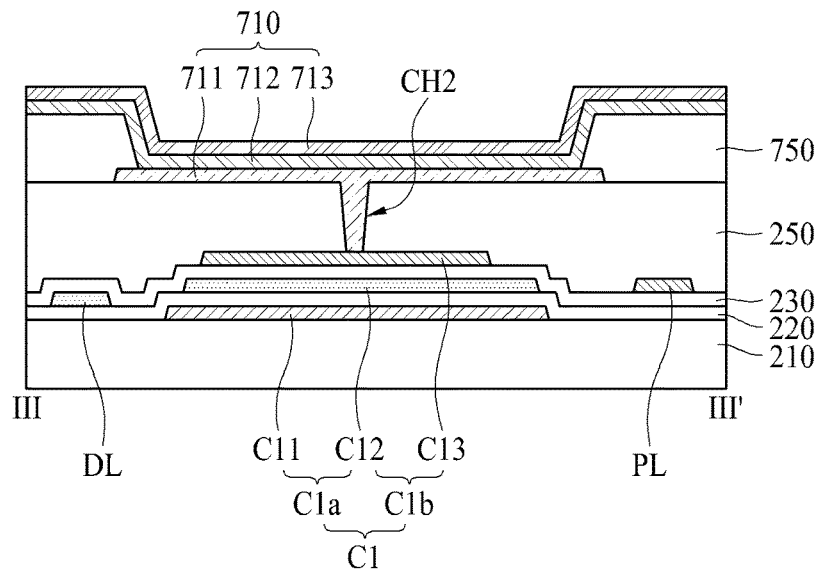
FIG. 6 is a cross-sectional view along III-III' of FIG. 3.

FIG. 2 is a circuit diagram illustrating a pixel (P) of FIG. 1. FIG. 3 is a plan view illustrating the pixel (P) of FIG. 2. FIG. 4 is a cross-sectional view along I-I' of FIG. 3. FIG. 5 is a cross-sectional view along II-II' of FIG. 3. FIG. 6 is a cross-sectional view along III-III' of FIG. 3.

Referring to FIGS. 2, 3, 4, and 5, the display apparatus 100 according to one embodiment of the present disclosure may include a substrate 210, a pixel driving circuit (PDC) on the substrate 210, and a display element (or emission element) 710 connected with the pixel driving circuit (PDC). The pixel driving circuit (PDC) includes thin film transistors (TR1, TR2).

The circuit diagram of FIG. 2 is an equivalent circuit diagram for a pixel (P) in the display apparatus 100 including an organic light emitting diode (OLED) functioning as the display element 710. Accordingly, the display apparatus 100 according to one embodiment of the present disclosure is an organic light emitting diode display apparatus.

The pixel driving circuit (PDC) of FIG. 2 includes a first thin film transistor (TR1) corresponding to a switching transistor, and a second thin film transistor (TR2) corresponding to a driving transistor.

The first thin film transistor (TR1) is connected with the gate line (GL) and the data line (DL), and the first thin film transistor (TR1) is turned-on or turned-off and performs the switch operation by the scan signal (SS) supplied through the gate line (GL).

The data line (DL) provides the data voltage (Vdata) to the pixel driving circuit (PDC), and the first thin film transistor (TR1) controls applying the data voltage (Vdata).

A driving power line (or driving voltage line, PL) provides a driving voltage (Vdd) to the display element 710, and the second thin film transistor (TR2) controls the driving voltage (Vdd). Herein, the driving voltage (Vdd) is a pixel driving voltage for driving the organic light emitting diode (OLED) corresponding to the display element 710.

The data line (DL) and the driving power line (PL) are lines configured to transmit signals. Thus, according to one embodiment of the present disclosure, the data line (DL) and the driving power line (PL) are referred to as signal lines. Also, the gate line (GL) may be also referred to as a signal line configured to transmit signals.

When the first thin film transistor (TR1) is turned-on, the data voltage (Vdata) supplied through the data line (DL) is supplied to a gate electrode (G2) of the second thin film transistor (TR2) connected with the display element 710. The data voltage (Vdata) is charged in a first capacitor (C1) provided between a source electrode (S2) and the gate electrode (G2) of the second thin film transistor (TR2). The first capacitor (C1) is a storage capacitor (Cst).

An amount of current supplied to the organic light emitting diode (OLED) corresponding to the display element 710 through the second thin film transistor (TR2) is controlled in accordance with the data voltage (Vdd), whereby it is possible to control a grayscale of light emitted from the display element 710.

Referring to FIGS. 4, 5, and 6, the display apparatus 100 according to one embodiment of the present disclosure includes the first thin film transistor (TR1) and the second thin film transistor (TR2) disposed on the substrate 210.

In detail, the display apparatus 100 according to one embodiment of the present disclosure includes the substrate 210, a first gate electrode (G1) on the substrate 210, a first active layer (A1) spaced apart from the first gate electrode (G1) and provided with at least a portion overlapping the first gate electrode (G1), a first source electrode (S1) and a first drain electrode (D1) connected with the first active layer (A1), a second gate electrode (G2) connected with any one of the first source electrode (S1) or the first drain electrode (D1), a second active layer (A2) spaced apart from the second gate electrode (G2) and provided with at least a portion overlapping the second gate electrode (G2), a second source electrode (S2) and a second drain electrode (D2) connected with the second active layer (A2), and the display element 710 connected with any one of the second source electrode (S2) or the second drain electrode (D2).

The substrate 210 may include glass or plastic. The substrate 210 may be formed of plastic having flexibility, for example, polyimide (PI).

The first gate electrode (G1) is disposed on the substrate 210. The first gate electrode (G1) may be a portion extended from the gate line (GL), or may be a portion of the gate line (GL). That is, in some embodiments, the first gate electrode (G1) and the gate line (GL) may be formed as a contiguous, integral structure. In one embodiment, because the first gate electrode (G1) and the gate line (GL) are formed together as part of the same manufacturing process and is formed using the same material at the same layer, the manufacturing cost and the manufacturing time of a display apparatus may be reduced.

Referring to FIGS. 3 and 4, the first gate electrode (G1) is a portion of the gate line (GL). According to one embodiment of the present disclosure, the first gate electrode (G1) and the gate line (GL) prevent ambient light from being incident on the first active layer (A1) and the second active layer (A2), to thereby protect the first active layer (A1) and the second active layer (A2).

The first gate electrode (G1) may include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). In some embodiments, the gate electrode (G1, G2) may have a multi-layered structure including at least two layers with different physical properties.

Also, referring to FIGS. 3 and 5, a first capacitor electrode (C11) is disposed on the substrate 210. The first capacitor electrode (C11) may be disposed on the same layer as that of the first gate electrode (G1), and may be formed of the same material as that of the first gate electrode (G1). For example, the first gate electrode (G1) may be formed as one electrode of the first capacitor (C1) (e.g., the first capacitor electrode (C11)). In one embodiment, the first gate electrode (G1) and the first capacitor electrode (C11) is formed together as part of the same manufacturing process and is formed using the same material at the same layer. Such manufacturing process have the benefit of reducing cost as well as reducing manufacturing time of a display apparatus.

A first gate insulating film 220 is disposed on the first gate electrode (G1) and the first capacitor electrode (C11). The first gate insulating film 220 is formed of an insulating material, and the first insulating film 220 insulates the first gate electrode (G1) and the first active layer (A1) from each other. The first gate insulating film 220 includes an insulating material. For example, the first gate insulating film 220 may be formed of an insulating material such as a silicon oxide and a silicon nitride.

The first active layer (A1) is disposed on the first gate insulating film 220. The first active layer (A1) is spaced apart from the first gate electrode (G1), and at least a portion of the first active layer (A1) is overlapping the first gate electrode (G1).

According to one embodiment of the present disclosure, the first active layer (A1) includes an oxide semiconductor material. For example, the first active layer (A1) may include at least one among IZO (InZnO)-based oxide semiconductor, IGO (InGaO)-based oxide semiconductor, GO (GaO)-based oxide semiconductor, ITO (InSnO)-based oxide semiconductor, IGZO (InGaZnO)-based oxide semiconductor, IGTO (InGaSnO)-based oxide semiconductor, IGZTO (InGaZnSnO)-based oxide semiconductor, GZTO (GaZnSnO)-based oxide semiconductor, GZO (GaZnO)-based oxide semiconductor, or ITZO (InSnZnO)-based oxide semiconductor. However, one embodiment of the present disclosure is not limited to the above materials. The first active layer (A1) may include other oxide semiconductor materials.

Referring to FIG. 4, the first active layer (A1) may have a multi-layered structure. Referring to FIG. 4, the first active layer (A1) includes a first oxide semiconductor layer (A11) on the first gate electrode (G1), and a second oxide semiconductor layer (A12) on the first oxide semiconductor layer (A11). The first active layer (A1) may be disposed on the first gate insulating film 220.

According to one embodiment of the present disclosure, the first oxide semiconductor layer (A11) functions as a channel layer, and the second oxide semiconductor layer (A12) functions as a protection layer for protecting the first oxide semiconductor layer (A11). A channel of the first active layer (A1) is generally provided in the first oxide semiconductor layer (A11).

For example, the first oxide semiconductor layer (A11), which functions as a channel layer, may include at least one among IZO (InZnO)-based oxide semiconductor, IGO (InGaO)-based oxide semiconductor, ITO (InSnO)-based oxide semiconductor, IGZO (InGaZnO)-based oxide semiconductor, IGZTO (InGaZnSnO)-based oxide semiconductor, GZTO (GaZnSnO)-based oxide semiconductor, GZO (GaZnO)-based oxide semiconductor, or ITZO (InSnZnO)-based oxide semiconductor. However, one embodiment of the present disclosure is not limited to the above materials. The first oxide semiconductor layer (A11) may be formed of other oxide semiconductor materials generally known to those in the art.

The second oxide semiconductor layer (A12), which functions as a protection layer, has an acceptable film stability. According to one embodiment of the present disclosure, the second oxide semiconductor layer (A12) may include at least one among IGZO (InGaZnO)-based oxide semiconductor material, IGO (InGaO)-based oxide semiconductor material, IGTO (InGaSnO)-based oxide semiconductor material, IGZTO (InGaZnSnO)-based oxide semiconductor material, GZTO (GaZnSnO)-based oxide semiconductor material, GO (GaO)-based oxide semiconductor material, or GZO (GaZnO)-based oxide semiconductor material. However, one embodiment of the present disclosure is not limited to the above materials. The second oxide semiconductor layer (A12) may be formed of other oxide semiconductor materials generally known to those in the art.

The first oxide semiconductor layer (A11) has the electrical properties which are greater than that of the second oxide semiconductor layer (A12), and the second oxide semiconductor layer (A12) has the greater film stability than that of the first oxide semiconductor layer (A11). Also, according to one embodiment of the present disclosure, the first oxide semiconductor layer (A11) of the first active layer (A1) has the greater tolerance to etching than that of the second oxide semiconductor layer (A12) of the first active layer (A1), whereby the first active layer (A1) may have a stable tapered shape.

The first source electrode (S1) and the first drain electrode (D1) are disposed on the first active layer (A1). The first source electrode (S1) and the first drain electrode (D1) are spaced apart from each other, and are respectively connected with the first active layer (A1).

According to one embodiment of the present disclosure, the data line (DL) is disposed on the same layer as those of the first source electrode (S1) and the first drain electrode (D1). The data line (DL), the first source electrode (S1) and the first drain electrode (D1) may be manufactured by the same process using the same material. The data line (DL) may be formed as one body with any one of the first source electrode (S1) and the first drain electrode (D1). For example, the data line (DL) may be integrally formed with either the first source electrode (S1) or the first drain electrode (D1). In this embodiment, it is thus comprised of the very same material and made in the same process steps at the same time.

According to one embodiment of the present disclosure, the first gate electrode (G1), the first active layer (A1), the first source electrode (S1) and the first drain electrode (D1) constitute the first thin film transistor (TR1).

Referring to FIG. 4, the first gate electrode (G1) is disposed between the substrate 210 and the first active layer (A1). As shown in FIG. 4, a structure of the first thin film transistor (TR1) where the first gate electrode (G1) is disposed below the first active layer (A1) is referred to as a bottom gate structure.

For a manufacturing process of the first thin film transistor (TR1) having the bottom gate structure, an etching process may be carried out when the first source electrode (S1) and the first drain electrode (D1) are formed on the first active layer (A1). In this case, the first active layer (A1) may be exposed to the etching process. If the first active layer (A1) is exposed to the etching process, the first active layer (A1) may be damaged. If the first active layer (A1) is damaged, it may lower the mobility and electrical properties of the first active layer (A1). As a result, the switching properties of the first thin film transistor (TR1) may be lowered, and an s-factor (or stability factor) value of the first thin film transistor (TR1) may be increased. It is beneficial for the stability factor to be as low as possible.

According to one embodiment of the present disclosure, the first active layer (A1) has a dual-layered structure, and the upper-positioned second oxide semiconductor layer (A12) protects the first oxide semiconductor layer (A11). As a result, the first oxide semiconductor layer (A11) functioning as the channel layer may maintain the good electrical properties and the good switching properties without any damage.

According to one embodiment of the present disclosure, it has a deposition structure of the two oxide semiconductor layers, whereby the first thin film transistor (TR1) having the small s-factor value and the good switching properties may be used as a switching transistor.

Referring to FIG. 4, the second gate electrode (G2) is disposed on the same layer as those of the first source electrode (S1) and the first drain electrode (D1). In detail, the second gate electrode (G2) may be disposed on the first gate insulating film 220.

The second gate electrode (G2), the first source electrode (S1) and the first drain electrode (D1) may be manufactured together by the same process using the same material. The second gate electrode (G2) may be formed as one body with any one of the first source electrode (S1) or the first drain electrode (D1). For example, as shown in FIG. 4, the second gate electrode (G2) is integrally formed with the first drain electrode (D1). It is thus comprised of the very same material and made in the same process steps at the same time.

According to one embodiment of the present disclosure, the data line (DL) is connected with any one of the first source electrode (S1) and the first drain electrode (D1), and the second gate electrode (G2) is connected with the other of the first source electrode (S1) and the first drain electrode (D1).

Referring to FIGS. 3, 4, and 5, the data line (DL) is connected with the first source electrode (S1), and the second gate electrode (G2) is connected with the first drain electrode (D1).

According to one embodiment of the present disclosure, the data line (DL), the first source electrode (S1), the first drain electrode (D1) and the second gate electrode (G2) may be manufactured by the same process using the same material.

Referring to FIGS. 3 and 5, a second capacitor electrode (C12) is disposed on the same layer as those of the first source electrode (S1) and the first drain electrode (D1). In detail, the second capacitor electrode (C12) may be disposed on the first gate insulating film 220.

The second capacitor electrode (C12), the first source electrode (S1) and the first drain electrode (D1) may be manufactured together by the same process using the same material. The second capacitor electrode (C12) may be formed as one body with any one of the first source electrode (S1) or the first drain electrode (D1). For example, as shown in FIG. 5, the second capacitor electrode (C12) is integrally formed with the first drain electrode (D1). It is thus comprised of the very same material and made in the same process steps at the same time.

According to one embodiment of the present disclosure, the data line (DL), the first source electrode (S1), the first drain electrode (D1), the second gate electrode (G2), and the second capacitor electrode (C12) may be manufactured by the same process using the same material.

Referring to FIGS. 3, 4 and 5, the first drain electrode (D1), the second gate electrode (G2) and the second capacitor electrode (C12) may be formed as one body.

A second gate insulating film 230 is disposed on the first source electrode (S1), the first drain electrode (D1), the second gate electrode (G2) and the second capacitor electrode (C12). The second gate insulating film 230 has the insulating properties.

The second active layer (A2) is disposed on the second gate insulating film 230. The second active layer (A2) is spaced apart from the second gate electrode (G2), and at least a portion of the second active layer (A2) is overlapped with the second gate electrode (G2).

Referring to FIG. 4, the second gate electrode (G2) is disposed between the substrate 210 and the second active layer (A2). Also, with respect to the substrate 210, the second active layer (A2) is disposed to be higher than the first active layer (A1). For example, the second active layer (A2) is disposed to be relatively farther away from the substrate 210 than the first active layer (A1).

According to one embodiment of the present disclosure, the second active layer (A2) includes an oxide semiconductor material. For example, the second active layer (A2) may include at least one among IZO (InZnO)-based oxide semiconductor, IGO (InGaO)-based oxide semiconductor, GO (GaO)-based oxide semiconductor, ITO (InSnO)-based oxide semiconductor, IGZO (InGaZnO)-based oxide semiconductor, IGTO (InGaSnO)-based oxide semiconductor, IGZTO (InGaZnSnO)-based oxide semiconductor, GZTO (GaZnSnO)-based oxide semiconductor, GZO (GaZnO)-based oxide semiconductor, or ITZO (InSnZnO)-based oxide semiconductor. However, one embodiment of the present disclosure is not limited to the above materials. The second active layer (A2) may include other oxide semiconductor materials.

The second source electrode (S2) and the second drain electrode (D2) are disposed on the second active layer (A2). The second source electrode (S2) and the second drain electrode (D2) are spaced apart from each other, and are respectively connected with the second active layer (A2).

According to one embodiment of the present disclosure, the driving power line (PL) is disposed on the same layer as those of the second source electrode (S2) and the second drain electrode (D2). The driving power line (PL), the second source electrode (S2) and the second drain electrode (D2) may be manufactured together by the same process using the same material. The driving power line (PL) may be formed as one body with any one of the second source electrode (S2) and the second drain electrode (D2).

For example, as shown in FIGS. 3 and 4, the driving power line (PL) may be formed as one body with the second drain electrode (D2).

Referring to FIGS. 3 and 5, a third capacitor electrode (C13) is disposed on the same layer as those of the second source electrode (S2) and the second drain electrode (D2). In detail, the third capacitor electrode (C13) may be disposed on the second gate insulating film 230.

The third capacitor electrode (C13), the second source electrode (S2) and the second drain electrode (D2) may be manufactured together by the same process using the same material. The third capacitor electrode (C13) may be formed as one body with any one of the second source electrode (S2) and the second drain electrode (D2).

Referring to FIGS. 3, 4, and 5, the second source electrode (S2) and the third capacitor electrode (C13) may be formed as one body. Also, the driving power line (PL), the third capacitor electrode (C13), the second source electrode (S2) and the second drain electrode (D2) may be manufactured together by the same process using the same material.

Referring to FIGS. 3 and 5, the first capacitor electrode (C11) and the third capacitor electrode (C13) may be connected with each other. In detail, the first capacitor electrode (C11) and the third capacitor electrode (C13) may be connected with each other via a first contact hole (CH1) formed in the first gate insulating film 220 and the second gate insulating film 230.

According as the first capacitor electrode (C11) and the third capacitor electrode (C13) may be connected with each other, the same voltage may be applied to the third capacitor electrode (C13) and the first capacitor electrode (C11). Accordingly, a first capacitance (C1$a$) is formed between the first capacitor electrode (C11) and the second capacitor electrode (C12), a second capacitance (C1$b$) is formed between the second capacitor electrode (C12) and the third capacitor electrode (C13), and the sum of the first capacitance (C1$a$) and the second capacitance (C1$b$) may be a total capacitance of the first capacitor (C1). As a result, as the total capacitance of the first capacitor (C1) is increased, it is possible to stably drive the display apparatus 100.

According to one embodiment of the present disclosure, the second gate electrode (G2), the second active layer (A2), the second source electrode (S2) and the second drain electrode (D2) constitute the second thin film transistor (TR2).

Referring to FIG. 4, the second gate electrode (G2) is disposed between the substrate 210 and the second active layer (A2). As shown in FIG. 4, the second thin film transistor (TR2) has a bottom gate structure where the second gate electrode (G2) is disposed below the second active layer (A2).

For a manufacturing process of the second thin film transistor (TR2) having the bottom gate structure, an etching process may be carried out when the second source electrode (S2) and the second drain electrode (D2) are formed on the second active layer (A2). If the second active layer (A2) is exposed to the etching process, the second active layer (A2) may be damaged. If the second active layer (A2) is damaged, the mobility and electrical properties of the second active layer (A2) may be lowered. As a result, the switching properties of the second thin film transistor (TR2) may be lowered, and the s-factor value of the second thin film transistor (TR2) may be increased.

Referring to FIG. 4, the second active layer (A2) has a single-layered structure. Unlike the first active layer (A1), the second active layer (A2) is not provided with an additional protection film. Thus, for the manufacturing process of the second thin film transistor (TR2), the second active layer (A2) is directly exposed to the etching process so that the mobility and the electrical properties of the second active layer (A2) may be lowered. Accordingly, the second thin film transistor (TR2) has the relatively large s-factor value in comparison to that of the first thin film transistor (TR1).

According to one embodiment of the present disclosure, a composition of a metal in the second active layer (A2) having one oxide semiconductor layer may be substantially identical to a composition of a metal included in the first oxide semiconductor layer (A11) of the first active layer (A1). Even though the composition of the metal in the second active layer (A2) having one oxide semiconductor layer may be substantially identical to the composition of the metal included in the first oxide semiconductor layer (A11) of the first active layer (A1), the second active layer (A2) is exposed to the etching process, however, the first oxide semiconductor layer (A11) of the first active layer (A1) is not exposed to the etching process. Thus, the electrical properties of the second active layer (A2) may be damaged, but the electrical properties of the first oxide semiconductor layer (A11) included in the first active layer (A1) are scarcely damaged. Accordingly, the first thin film transistor (TR1) having the first oxide semiconductor layer (A11) may have the relatively small s-factor value in comparison to that of the second thin film transistor (TR2).

According to one embodiment of the present disclosure, the first thin film transistor (TR1) having the relatively small s-factor value may be used as the switching transistor, and the second thin film transistor (TR2) having the relatively large s-factor value may be used as the driving transistor.

Referring to FIGS. 4 and 5, a protection layer 250 is disposed on the driving power line (PL), the third capacitor electrode (C13), the second source electrode (S2) and the second drain electrode (D2). The protection layer 250 planarizes upper surfaces of the driving power line (PL), the third capacitor electrode (C13), the second source electrode (S2) and the second drain electrode (D2), and also protects the pixel driving circuit (PDC). The protection layer 250 is referred to as a planarization layer.

The display element 710 is disposed on the protection layer 250. In detail, a first electrode 711, an emission layer 712 and a second electrode 713 are sequentially disposed on the protection layer 250, to thereby form the display element 710.

The first electrode 711 of the display element 710 is disposed on the protection layer 250. The first electrode 711 may be connected with any one of the second source electrode (S2) and the second drain electrode (D2) included in the second thin film transistor (TR2) via a second contact hole (CH2). The second contact hole (CH2) may be provided in the protection layer 250. In detail, referring to FIG. 3, the third capacitor electrode (C13) is formed as one body with the second source electrode (S2), and is connected with the second source electrode (S2). Thus, as shown in FIG. 5, the first electrode 711 of the display element 710 contacts the third capacitor electrode (C13), whereby the first electrode 711 of the display element 710 is connected with the second source electrode (S2) of the second thin film transistor (TR2).

In some embodiments, a bank layer 750 is disposed in the periphery of the first electrode 711. The bank layer 750 defines an emission area of the display element 710.

The emission layer 712 is disposed on the first electrode 711. Herein, the emission layer 712 is an organic emission layer including an organic material. The second electrode 713 is disposed on the emission layer 712. Accordingly, the display element 710 is formed.

The display element 710 shown in FIG. 4 is an organic light emitting diode (OLED). Thus, the display apparatus 100 according to one embodiment of the present disclosure is an organic light emitting diode display apparatus.

According to one embodiment of the present disclosure, the thin film transistors (TR1, TR2) having the bottom gate structure are used as the switching transistor and the driving transistor. The thin film transistor having the bottom gate structure occupies a relatively small size in comparison to that of a thin film transistor having a top gate structure. Thus, according to one embodiment of the present disclosure, in comparison to a case using the thin film transistor having the top gate structure, the thin film transistor having the bottom gate structure enables an arrangement of a large number of thin film transistors in a small area. Thus, it is possible to realize a high integration of the thin film transistors in the display apparatus 100 according to one embodiment of the present disclosure.

Also, according to one embodiment of the present disclosure, the first thin film transistor (TR1) which has the good switching properties owing to the relatively small s-factor value is used as the switching transistor, and the second thin film transistor (TR2) which is favorable to a grayscale expression owing to the relatively large s-factor value is used as the driving transistor, whereby it is possible to improve a driving efficiency of the display apparatus 100.

Figure 7:
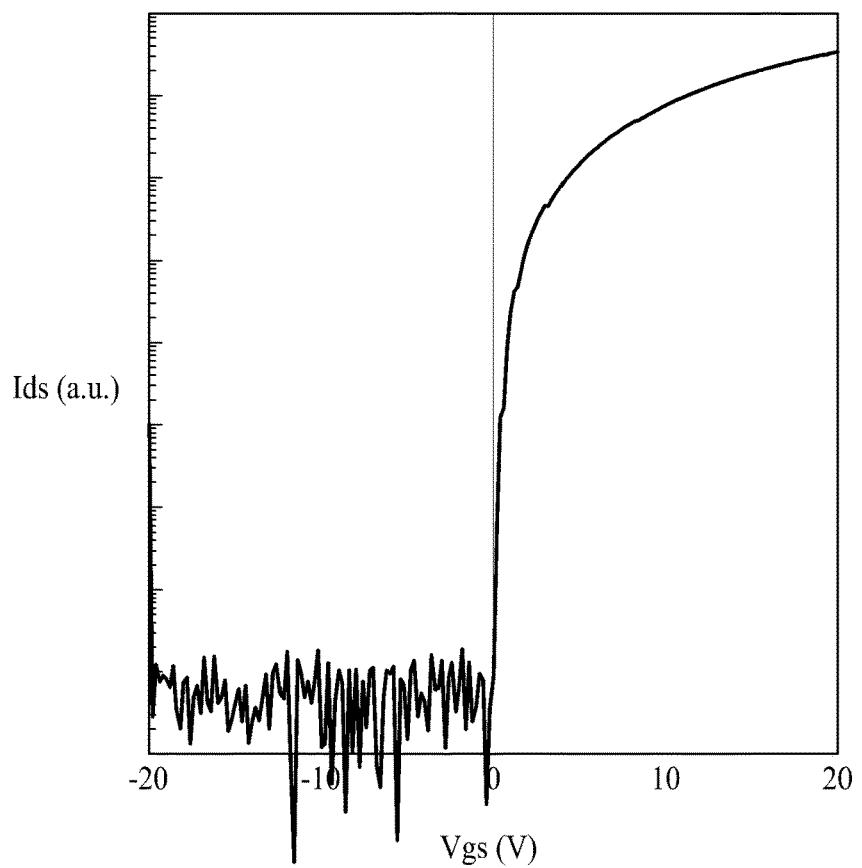
FIG. 7 is a graph illustrating a threshold voltage of a first thin film transistor in FIG. 3.
Figure 8:
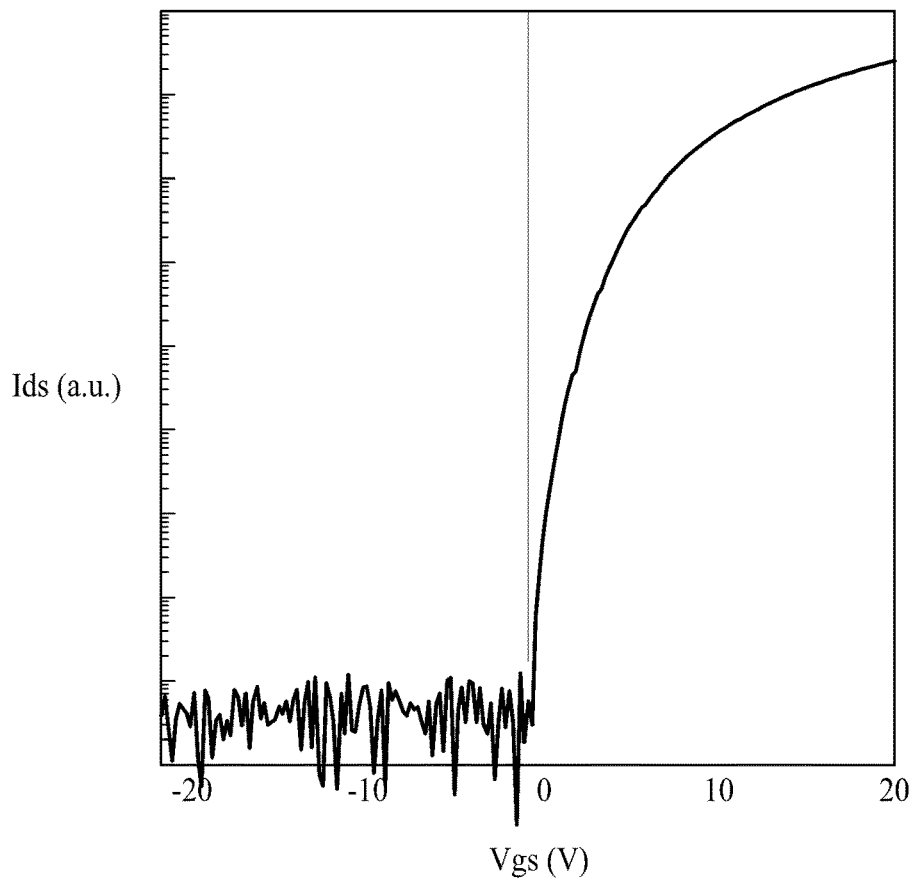
FIG. 8 is a graph illustrating a threshold voltage of a second thin film transistor in FIG. 3.

FIG. 7 is a graph illustrating a threshold voltage of the first thin film transistor (TR1) in FIG. 3. FIG. 8 is a graph illustrating a threshold voltage of the second thin film transistor (TR2) in FIG. 3.

The s-factor (sub-threshold swing: s-factor) may be obtained by a reciprocal number of an inclination in a graph of a gate voltage (Vgs) to a drain-source current (Ids) for a threshold voltage (Vth) section of a thin film transistor. If the s-factor value is small, a change rate of the drain-source current (Ids) to the gate voltage (Vgs) for the threshold voltage (Vth) section is large, whereby it has the good switching properties.

Referring to FIG. 7, in case of the first thin film transistor (TR1) including the first oxide semiconductor layer (A11) protected by the second oxide semiconductor layer (A12) functioning as a protection film and maintaining the good electrical properties, a change rate of the drain-source current (Ids) to the gate voltage (Vgs) for the threshold voltage (Vth) section is large. Accordingly, the first thin film transistor (TR1) has the small s-factor value and also has the good switching properties.

Referring to FIG. 8, in case of the second thin film transistor (TR2) having no additional protection film configured to protect the first oxide semiconductor layer (A11), a change rate of the drain-source current (Ids) to the gate voltage (Vgs) for the threshold voltage (Vth) section is relatively small. Thus, the second thin film transistor (TR2) has the relatively large s-factor value, and the change rate of the drain-source current (Ids) to the gate voltage (Vgs) for the threshold voltage (Vth) section is gentle.

Accordingly, it facilitates to control a level of the drain-source current (Ids) of the second thin film transistor (TR2) by adjusting a voltage applied to the second gate electrode (G2) of the second thin film transistor (TR2). A pixel grayscale may be controlled by controlling a level of the drain-source current (Ids). When it facilitates to control a level of the drain-source current (Ids), it facilitates to control the pixel grayscale. Thus, according to one embodiment of the present disclosure, if the second thin film transistor (TR2) is used as the driving thin film transistor, it facilitates to control a grayscale expression of a pixel.

Figure 9:
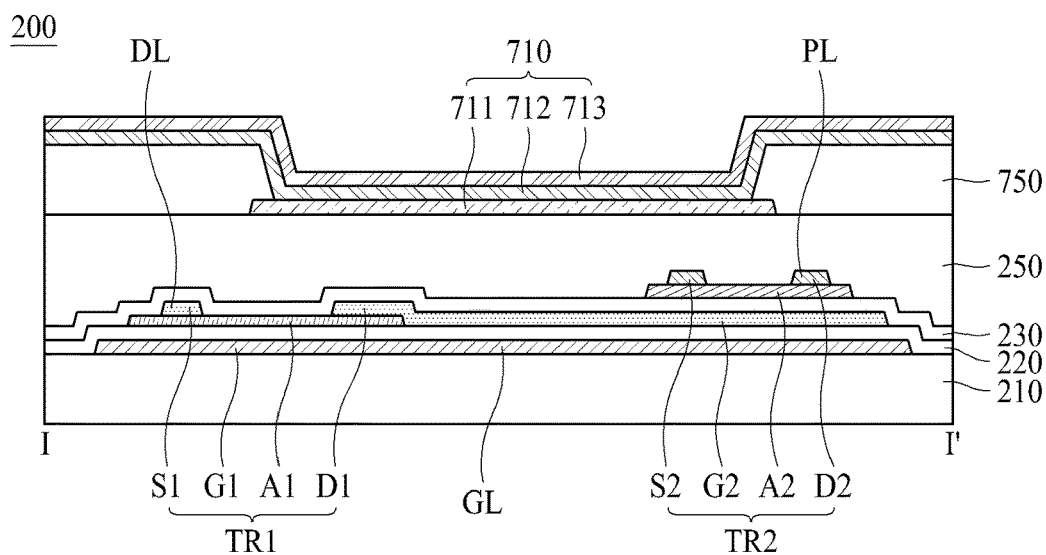
FIG. 9 is a cross-sectional view illustrating a pixel of a display apparatus according to another embodiment of the present disclosure.

FIG. 9 is a cross-sectional view illustrating a pixel of a display apparatus 200 according to another embodiment of the present disclosure.

Referring to FIG. 9, a first active layer (A1) of a first thin film transistor (TR1) is formed in a single-layered structure. In this case, it enables the first thin film transistor (TR1) to have a small s-factor value by adjusting a composition of the first active layer (A1) or adjusting an etching condition for a process of forming a first source electrode (S1) and a first drain electrode (D1).

In another way, an etch stopper (not shown) may be disposed on the first active layer (A1) so that it is possible to protect the first active layer (A1). Thus, it enables the first thin film transistor (TR1) to have a small s-factor value.

Figure 10:
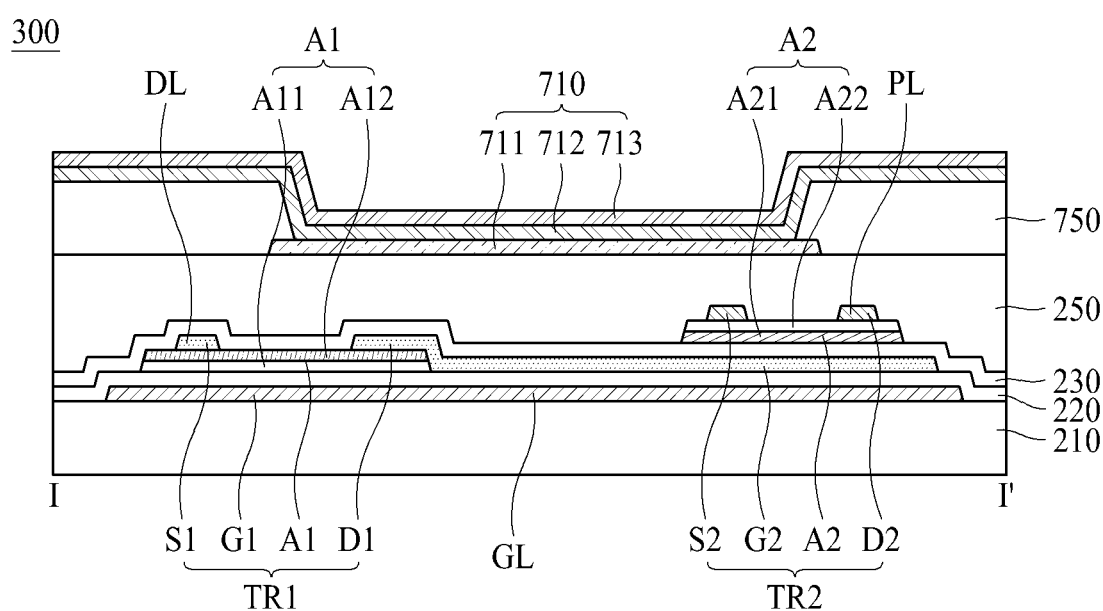
FIG. 10 is a cross-sectional view illustrating a pixel of a display apparatus according to another embodiment of the present disclosure.

FIG. 10 is a cross-sectional view illustrating a pixel of a display apparatus 300 according to another embodiment of the present disclosure.

A first active layer (A1) and a second active layer (A2) included in the display apparatus 300 of FIG. 10 have a multi-layered structure. Referring to FIG. 10, the first active layer (A1) includes a first oxide semiconductor layer (A11) and a second oxide semiconductor layer (A12), and the second active layer (A2) also includes a first oxide semiconductor layer (A21) and a second oxide semiconductor layer (A22).

In the display apparatus 300 of FIG. 10, it enables the second thin film transistor (TR2) to have a relatively larger s-factor value in comparison to that of the first thin film transistor (TR1) by adjusting a composition and a manufacturing condition of the first oxide semiconductor layer (A21) and the second oxide semiconductor layer (A22) constituting the second active layer (A2).

Figure 11:
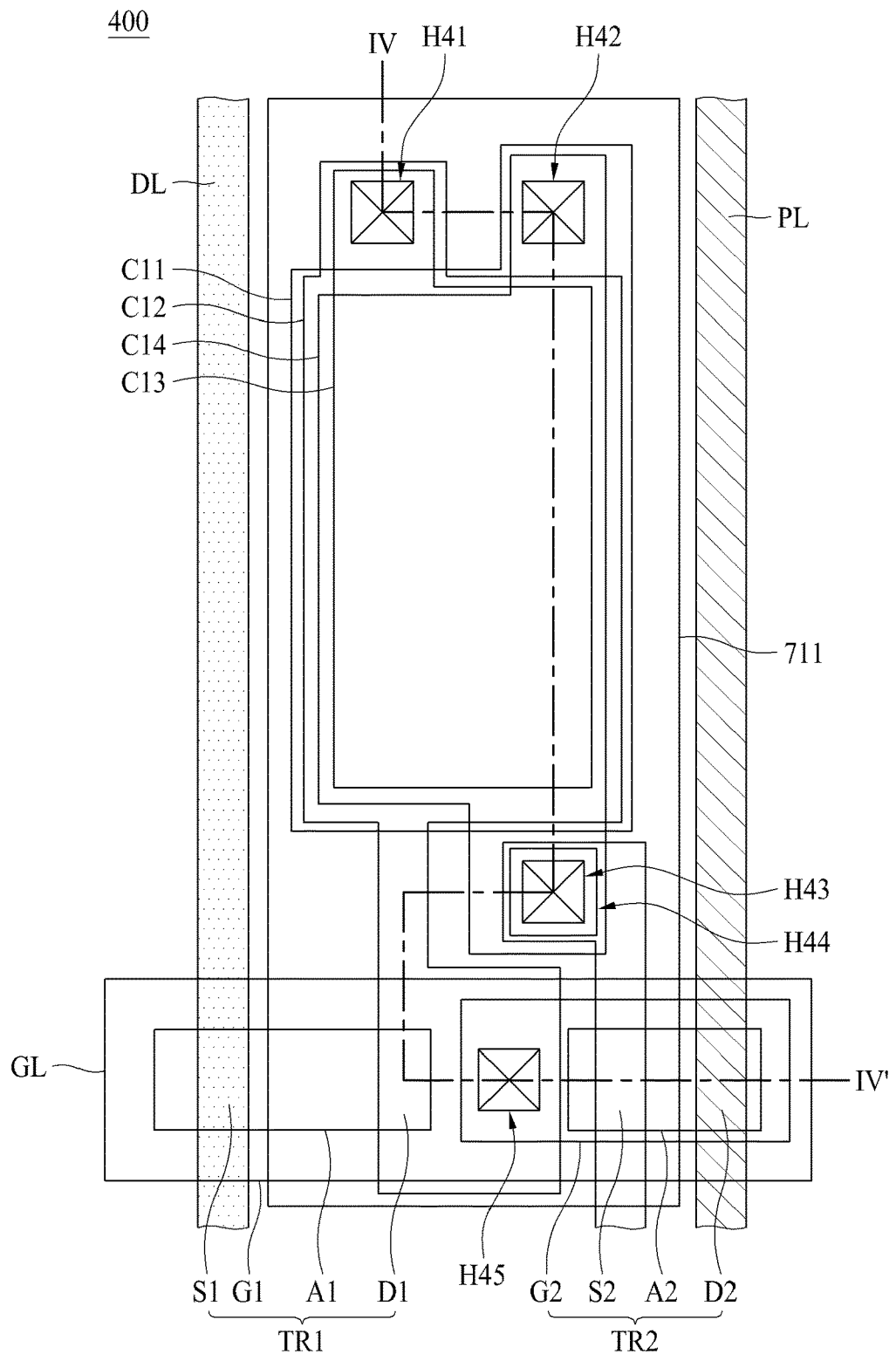
FIG. 11 is a plan view illustrating a pixel of a display apparatus according to another embodiment of the present disclosure.
Figure 12:
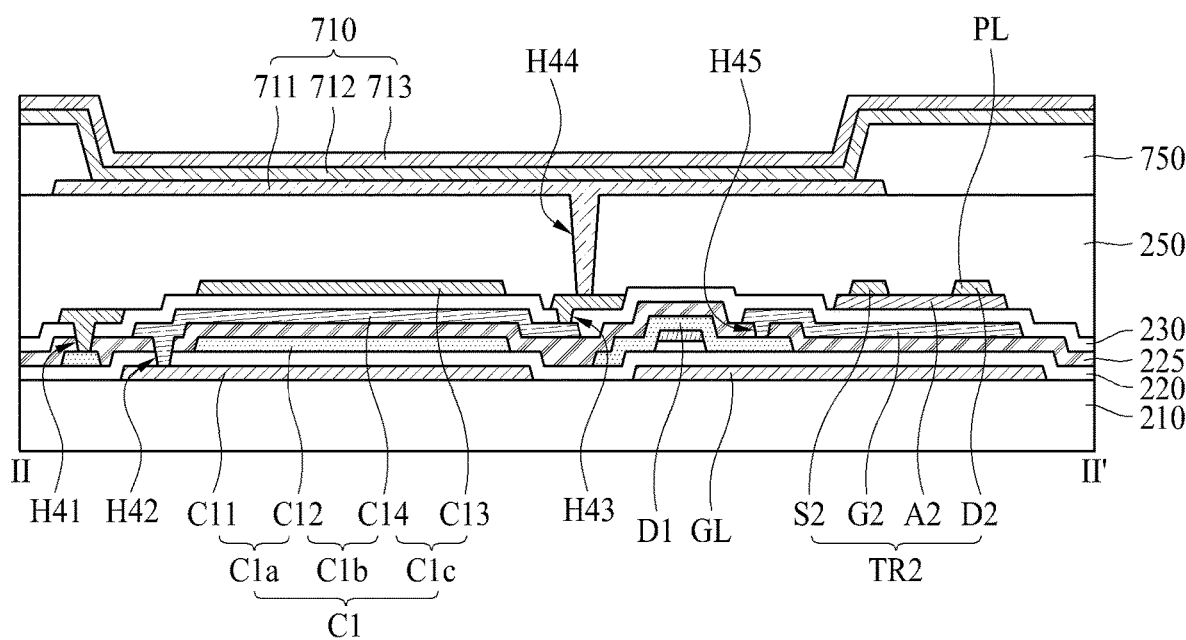
FIG. 12 is a cross-sectional view along IV-IV' of FIG. 11.

FIG. 11 is a plan view illustrating a pixel of a display apparatus 400 according to another embodiment of the present disclosure. FIG. 12 is a cross-sectional view along IV-IV' of FIG. 11.

The display apparatus 400 according to another embodiment of the present disclosure further includes a fourth capacitor electrode (C14) disposed on the same layer as that of a second gate electrode (G2). The fourth capacitor electrode (C14) is connected with any one of a second source electrode (S2) and a second drain electrode (D2). Also, a first capacitor electrode (C11) is connected with the fourth capacitor electrode (C14), and a second capacitor electrode (C12) is connected with a third capacitor electrode (C13).

The display apparatus 400 according to one embodiment of the present disclosure includes a first thin film transistor (TR1) and a second thin film transistor (TR2) disposed on a substrate 210.

In detail, referring to FIGS. 11 and 12, a first gate electrode (G1) and the first capacitor electrode (C11) are disposed on the substrate 210.

A first gate insulating film 220 is disposed on the first gate electrode (G1) and the first capacitor electrode (C11), and a first active layer (A1) is disposed on the first gate insulating film 220. The first active layer (A1) may include a first oxide semiconductor layer (A11) on the first gate electrode (G1), and a second oxide semiconductor layer (A12) on the first oxide semiconductor layer (A11).

A first source electrode (S1) and a first drain electrode (D1) are disposed on the first active layer (A1). Also, a data line (DL) and the second capacitor electrode (C12) are disposed on the same layer as those of the first source electrode (S1) and the first drain electrode (D1). The second capacitor electrode (C12) may be formed as one body with the first drain electrode (D1).

An insulating interlayer 225 is disposed on the first source electrode (S1), the first drain electrode (D1), the data line (DL), and the second capacitor electrode (C12).

The second gate electrode (G2) and the fourth capacitor electrode (C14) are disposed on the insulating interlayer 225. The second gate electrode (G2) and the fourth capacitor electrode (C14) are spaced apart from each other.

The second gate electrode (G2) is connected with the first drain electrode (D1) via a fifth contact hole (H45) formed in the insulating interlayer 225.

The fourth capacitor electrode (C14) is connected with the first capacitor electrode (C11) via a second contact hole (H42) formed in the insulating interlayer 225 and the first gate insulating film 220.

A second gate insulating film 230 is disposed on the second gate electrode (G2) and the fourth capacitor electrode (C14).

A second active layer (A2) is disposed on the second gate insulating film 230. The second active layer (A2) is spaced apart from the second gate electrode (G2), and at least a portion of the second active layer (A2) is overlapped with the second gate electrode (G2). The second active layer (A2) includes an oxide semiconductor material.

A second source electrode (S2) and a second drain electrode (D2) are disposed on the second active layer (A2). The second source electrode (S2) and the second drain electrode (D2) are spaced apart from each other, and are respectively connected with the second active layer (A2).

A driving power line (PL) is disposed on the same layer as those of the second source electrode (S2) and the second drain electrode (D2).

Any one of the second source electrode (S2) and the second drain electrode (D2) is connected with the fourth capacitor electrode (C14). Referring to FIGS. 11 and 12, the second source electrode (S2) may be connected with the fourth capacitor electrode (C14) via a third contact hole (H43) formed in the second gate insulating film 230.

Also, the third capacitor electrode (C13) is disposed on the same layer as those of the second source electrode (S2) and the second drain electrode (D2). In detail, the third capacitor electrode (C13) may be disposed on the second gate insulating film 230.

The third capacitor electrode (C13) may be connected with the second capacitor electrode (C12) via a first contact hole (H41) formed in the second gate insulating film 230 and the insulating interlayer 225.

A protection layer 250 is disposed on the second source electrode (S2), the second drain electrode (D2), the driving power line (PL) and the third capacitor electrode (C13).

A display element 710 is disposed on the protection layer 250. The display element 710 includes a first electrode 711, an emission layer 712 and a second electrode 713 disposed on the protection layer 250. The first electrode 711 of the display element 710 is connected with the second source electrode (S2) via a fourth contact hole (H44) formed in the protection layer 250.

Figure 13:
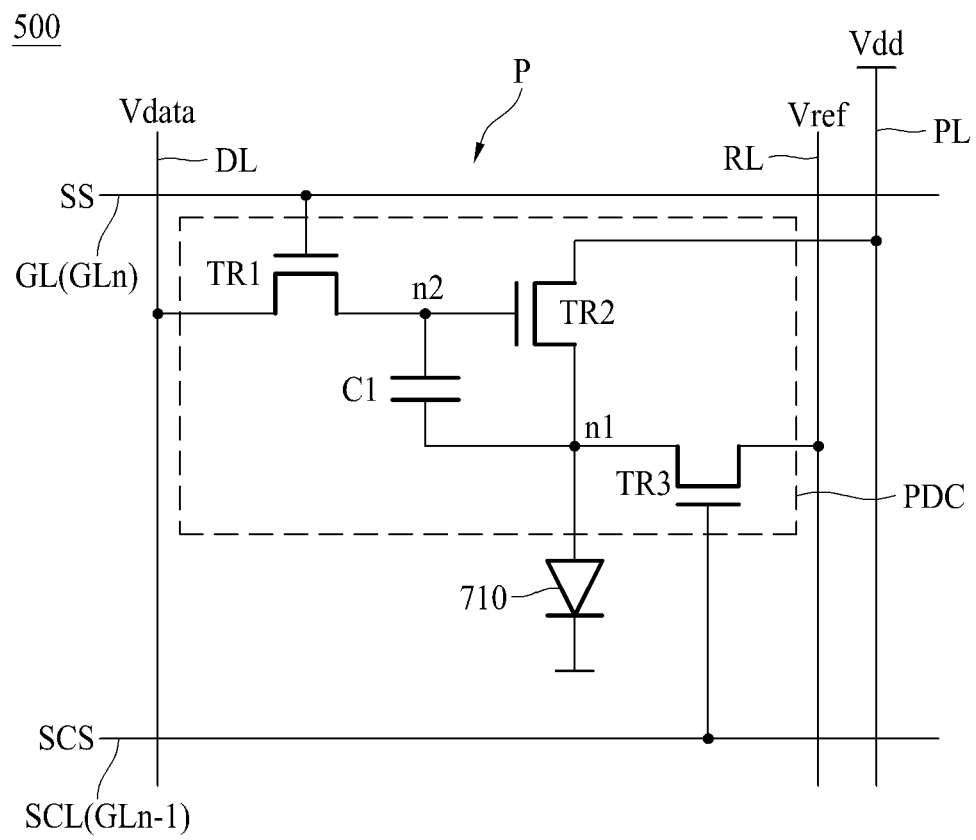
FIG. 13 is a circuit diagram illustrating any one pixel of a display apparatus according to another embodiment of the present disclosure.

FIG. 13 is a circuit diagram for any one pixel (P) of a display apparatus 500 according to another embodiment of the present disclosure. FIG. 13 is an equivalent circuit diagram for a pixel (P) of an organic light emitting display apparatus.

The pixel (P) of the display apparatus 500 shown in FIG. 13 includes an organic light emitting diode (OLED) corresponding to a display element 710, and a pixel driving circuit (PDC) for driving the display element 710. The display element 710 is connected with the pixel driving circuit (PDC).

In the pixel (P), there are signal lines (DL, GL, PL, RL, SCL) configured to supply signals to the pixel driving circuit (PDC).

A data voltage (Vdata) is supplied to a data line (DL), a scan signal (SS) is supplied to a gate line (GL), a driving voltage (Vdd) for driving the pixel is supplied to a driving power line (PL), a reference voltage (Vref) is supplied to a reference line (RL), and a sensing control signal (SCS) is supplied to a sensing control line (SCL).

Referring to FIG. 13, when the gate line of the (n)th pixel (P) is referred to as "$GL_n$," the gate line of the neighboring (n−1)th pixel (P) is "$GL_{n-1}$," and "$GL_{n-1}$" corresponding to the gate line of the (n−1)th pixel (P) serves as the sensing control line (SCL) of the (n)th pixel (P).

For example, as shown in FIG. 13, the pixel driving circuit (PDC) includes a first thin film transistor (TR1, switching transistor) connected with the gate line (GL) and the data line (DL), a second thin film transistor (TR2, driving transistor) configured to control a level of a current provided to the display element 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display element 710 and a gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) provided between the display element 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, a current is supplied to the display element 710 through the second thin film transistor (TR2) by the driving voltage (Vdd) for driving the pixel, whereby light is emitted from the display element 710.

Figure 14:
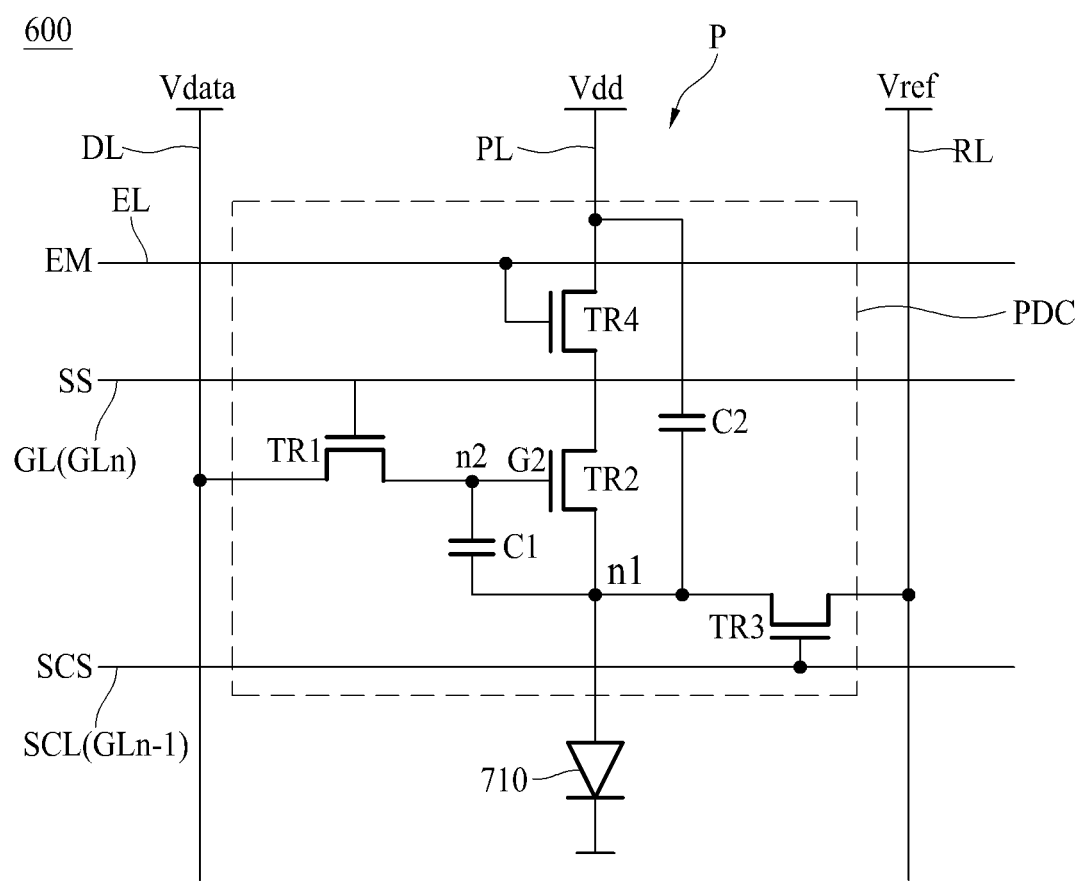
FIG. 14 is a circuit diagram illustrating any one pixel of a display apparatus according to another embodiment of the present disclosure.

FIG. 14 is a circuit diagram illustrating any one pixel (P) of a display apparatus 600 according to another embodiment of the present disclosure.

The pixel (P) of the display apparatus 600 shown in FIG. 14 includes an organic light emitting diode (OLED) corresponding to a display element 710, and a pixel driving circuit (PDC) configured to drive the display element 710. The display element 710 is connected with the pixel driving circuit (PDC).

The pixel driving circuit (PDC) includes thin film transistors (TR1, TR2, TR3, TR4).

In the pixel (P), there are signal lines (DL, EL, GL, PL, SCL, RL) configured to supply driving signals to the pixel driving circuit (PDC).

In comparison to the pixel (P) of FIG. 13, the pixel (P) of FIG. 14 further includes an emission control line (EL). An emission control signal (EM) is supplied to the emission control line (EL).

Also, in comparison to the pixel driving circuit (PDC) of FIG. 10, the pixel driving circuit (PDC) of FIG. 14 further includes a fourth thin film transistor (TR4) corresponding to an emission control transistor configured to control a light emission time point of the second thin film transistor (TR2).

Referring to FIG. 14, when the gate line of the (n)th pixel (P) is referred to as "$GL_n$," the gate line of the neighboring (n−1)th pixel (P) is "$GL_{n-1}$," and "$GL_{n-1}$" corresponding to the gate line of the (n−1)th pixel (P) serves as the sensing control line (SCL) of the (n)th pixel (P).

A first capacitor (C1) is positioned between the display element 710 and a gate electrode (G2) of the second thin film transistor (TR2). Also, a second capacitor (C2) is positioned between one electrode of the display element 710 and a terminal supplied with a driving voltage (Vdd) among terminals of the fourth thin film transistor (TR4).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL). The third thin film transistor (TR3) is turned-on or turned-off by the sensing control signal (SCS), and the third thin film transistor (TR3) senses the properties of the second thin film transistor (TR2) corresponding to the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, a current is supplied to the second thin film transistor (TR2), whereby light is emitted from the display element 710.

The pixel driving circuit (PDC) according to another embodiment of the present disclosure may be formed in various structures in addition to the above-described structure. For example, the pixel driving circuit (PDC) may include five thin film transistors or more.

In a display apparatus according to an embodiment of the present disclosure, a plurality of thin film transistors are disposed on the different layers. In addition, a thin film transistor according to an embodiment of the present disclosure has a bottom gate structure, and thus occupies a relatively small size in comparison to that of a thin film transistor having a top gate structure. Resultantly, according to one embodiment of the present disclosure, a large number of thin film transistors can be arranged in a small area, and thus, it is possible to realize a high integration of the thin film transistors.

According to one embodiment of the present disclosure, a display apparatus includes a plurality of thin film transistors having the different s-factor values. A thin film transistor which has a relatively large s-factor value is used as a driving transistor, and a thin film transistor which has a relatively small s-factor value is used as a switching transistor. According to one embodiment of the present disclosure, each of a plurality of thin film transistors having the different operation properties is applied to a suitable use, and thus it is possible to improve a driving efficiency of the display apparatus.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
   a substrate;
   a first gate electrode on the substrate;
   a first active layer spaced apart from the first gate electrode and having a portion overlapping the first gate electrode;
   a first source electrode and a first drain electrode electrically connected with the first active layer respectively;
   a second gate electrode electrically connected with any one of the first source electrode or the first drain electrode;
   a second active layer spaced apart from the second gate electrode and having a portion overlapping the second gate electrode;

a second source electrode and a second drain electrode electrically connected with the second active layer respectively;

a display element electrically connected with any one of the second source electrode or the second drain electrode;

wherein the first gate electrode is disposed between the substrate and the first active layer, wherein the second gate electrode is disposed between the substrate and the second active layer, wherein the first source electrode, the first drain electrode, and the second gate electrode include the same material, wherein the first active layer and the second active layer include an oxide semiconductor material, and wherein the second active layer is positioned completely above the first active layer.

2. The display apparatus according to claim 1, wherein the second gate electrode is formed as one body with any one of the first source electrode or the first drain electrode.

3. The display apparatus according to claim 1, further comprising:
   a first capacitor electrode disposed on a same layer as that of the first gate electrode; and
   a second capacitor electrode formed as one body with any one of the first source electrode or the first drain electrode.

4. The display apparatus according to claim 1, wherein the display element includes an organic light emitting diode.

5. The display apparatus according to claim 1, wherein the second active layer is disposed to be relatively farther away than the first active layer with respect to the substrate.

6. The display apparatus according to claim 1, wherein the second gate electrode is at least partially on the first active layer and extends therefrom to overlap with the second active layer.

7. The display apparatus according to claim 1, wherein the first active layer includes:
   a first oxide semiconductor layer on the first gate electrode; and
   a second oxide semiconductor layer directly on the first oxide semiconductor layer.

8. The display apparatus according to claim 7, wherein the second active layer is formed of one oxide semiconductor layer, and
   wherein a composition of a metal included in the second active layer is substantially identical to a composition of a metal included in the first oxide semiconductor layer of the first active layer.

9. The display apparatus according to claim 1,
   wherein the first gate electrode, the first active layer, the first source electrode, and the first drain electrode constitute the first thin film transistor,
   wherein the second gate electrode, the second active layer, the second source electrode, and the second drain electrode constitute the second thin film transistor, and
   wherein an s-factor value of the second thin film transistor is larger than an s-factor value of the first thin film transistor.

10. The display apparatus according to claim 9, wherein the first thin film transistor includes a switching transistor, and the second thin film transistor includes a driving transistor.

11. The display apparatus according to claim 1, further comprising:

a third capacitor electrode disposed on a same layer as those of the second source electrode and the second drain electrode.

12. The display apparatus according to claim 11, further comprising a fourth capacitor electrode disposed on a same layer as that of the second gate electrode.

13. The display apparatus according to claim 12, wherein the fourth capacitor electrode is electrically connected with any one of the second source electrode or the second drain electrode.

14. The display apparatus according to claim 12, further comprising:
   a first capacitor electrode disposed on a same layer as that of the first gate electrode; and
   a second capacitor electrode formed as one body with any one of the first source electrode or the first drain electrode,
   wherein the first capacitor electrode is electrically connected with the fourth capacitor electrode, and the second capacitor electrode is electrically connected with the third capacitor electrode.

15. A display apparatus, comprising:
   a substrate;
   a first gate electrode on the substrate;
   a first active layer spaced apart from the first gate electrode and having a portion overlapping the first gate electrode;
   a first source electrode and a first drain electrode coupled with the first active layer respectively;
   a second gate electrode coupled with any one of the first source electrode or the first drain electrode;
   a second active layer spaced apart from the second gate electrode and having a portion overlapping the second gate electrode;
   a second source electrode and a second drain electrode coupled with the second active layer respectively;
   a display element coupled with any one of the second source electrode or the second drain electrode;
   wherein the first gate electrode is disposed between the substrate and the first active layer,
   wherein the second gate electrode is disposed between the substrate and the second active layer,
   wherein the first source electrode, the first drain electrode, and the second gate electrode includes the same material,
   wherein the first active layer and the second active layer include an oxide semiconductor material,
   wherein the second active layer includes:
     a first oxide semiconductor layer on the second gate electrode; and
     a second oxide semiconductor layer on the first oxide semiconductor layer, and
   wherein the second active layer is positioned completely above the first active layer.

16. The display apparatus according to claim 15, wherein the second gate electrode is formed as one body with any one of the first source electrode or the first drain electrode.

17. The display apparatus according to claim 15, wherein the display element includes an organic light emitting diode.

18. The display apparatus according to claim 15, wherein the second active layer is disposed to be relatively farther away than the first active layer with respect to the substrate.

19. The display apparatus according to claim 15,
   wherein the first gate electrode, the first active layer, the first source electrode, and the first drain electrode constitute the first thin film transistor, wherein the second gate electrode, the second active layer, the second source electrode, and the second drain electrode constitute the second thin film transistor, and wherein an s-factor value of the second thin film transistor is larger than an s-factor value of the first thin film transistor.

20. The display apparatus according to claim 19, wherein the first thin film transistor includes a switching transistor, and the second thin film transistor includes a driving transistor.

21. A display apparatus, comprising:
- a substrate;
- a first gate electrode on the substrate;
- a first active layer spaced apart from the first gate electrode and having a portion overlapping the first gate electrode;
- a first source electrode and a first drain electrode on and contacting the first active layer;
- a second gate electrode electrically connected with any one of the first source electrode or the first drain electrode;
- a second active layer spaced apart from the second gate electrode and having a portion overlapping the second gate electrode;
- a second source electrode and a second drain electrode on and contacting the second active layer; and
- a display element electrically connected with any one of the second source electrode or the second drain electrode;

wherein the first gate electrode is disposed between the substrate and the first active layer, wherein the second gate electrode is disposed between the first gate electrode and the second active layer, and wherein the second active layer is positioned completely above the first active layer.

22. The display apparatus of claim 21, wherein the first active layer has a first surface and a second surface extending from the first surface, wherein the first source electrode and the first drain electrode are on the first surface and contacts the first surface of the first active layer, and wherein either the first source electrode or the first drain electrode extends toward the second active layer and contacts the second surface of the first active layer.

* * * * *